United States Patent

Oda

[11] Patent Number: 5,976,962
[45] Date of Patent: Nov. 2, 1999

[54] METHOD OF FABRICATING SEMICONDUCTOR DEVICE

[75] Inventor: Noriaki Oda, Tokyo, Japan

[73] Assignee: NEC Corporation, Japan

[21] Appl. No.: 09/006,067

[22] Filed: Jan. 12, 1998

Related U.S. Application Data

[62] Division of application No. 08/786,525, Jan. 19, 1997, Pat. No. 5,750,437.

[30] Foreign Application Priority Data

Jan. 23, 1996 [JP] Japan .................................. 8-009126

[51] Int. Cl.$^6$ ............................................. H01L 21/3205
[52] U.S. Cl. ........................... 438/592; 438/72; 438/683
[58] Field of Search .................................. 438/305, 307, 438/683, 585, 592, 963, 721

[56] References Cited

U.S. PATENT DOCUMENTS

| | | | |
|---|---|---|---|
| 5,710,438 | 1/1998 | Oda et al. | 257/69 |
| 5,736,455 | 4/1998 | Iyer et al. | 438/592 |
| 5,776,822 | 7/1998 | Fujii et al. | 438/586 |
| 5,902,121 | 5/1999 | Goto | 438/199 |

FOREIGN PATENT DOCUMENTS

| | | |
|---|---|---|
| 63-258070 | 10/1988 | Japan . |
| 644069 | 1/1989 | Japan . |

Primary Examiner—Richard Booth
Attorney, Agent, or Firm—Hayes, Soloway, Hennessey, Grossman & Hage, P.C.

[57] ABSTRACT

There is provided a method of fabricating a semiconductor device, including the steps of (a) forming impurity-diffused layers at a surface of a silicon semiconductor substrate in selected regions, (b) forming a refractory metal film over the impurity-diffused layers, (c) carrying out first thermal annealing in nitrogen atmosphere to convert the refractory metal film into a refractory metal silicide layer, (d) causing damage to a denaturated layer having been formed over the refractory metal film due to the first thermal annealing, (e) etching both the denaturated layer and non-reacted portions of the refractory metal film with a solution containing ammonia and hydrogen peroxide therein, and (f) carrying out second thermal annealing in nitrogen atmosphere to reduce resistance of the refractory metal silicide layer. For instance, the damage is caused to the denaturated layer by arsenic (As) ion implantation. The damage may be caused to the denaturated layer by exposing to oxygen plasma. As an alternative, the damage may be caused to the denaturated layer by carrying out third thermal annealing in oxygen atmosphere at a lower temperature than a temperature at which the second thermal annealing is to be carried out. The above mentioned method makes it possible to prevent occurrence of current leakage which would be accompanied with silicidation, without increasing the number of photoresist steps.

8 Claims, 8 Drawing Sheets

METHOD OF FABRICATING SEMICONDUCTOR DEVICE

This is a divisional of application Ser. No. 08/786,525 filed on Jan. 21, 1997 now U.S. Pat. No. 5,750,437.

BACKGROUND OF THE INVENTION

1. Field of the Invention

The invention relates to a method of fabricating a semiconductor device employing a refractory metal silicide layer as an electrode.

2. Description of the Related Art

Hereinbelow is explained, with reference to FIGS. 1A to 1F, a conventional method of fabricating a semiconductor device employing a titanium silicide layer as an electrode. A semiconductor device described hereinbelow is of n-channel MOS type.

First, as illustrated in FIG. 1A, there are formed silicon dioxide films 2 having a thickness of about 300 nm at a surface of a p-type silicon semiconductor substrate 1. The silicon dioxide films 2 act as device isolation regions between which are defined device formation regions where a device is to be established. Then, ion implantations are carried out over the device formation region to thereby form a gate oxide film 3 having a thickness of 10 nm over the device formation region and further a polysilicon film 4 having a thickness of about 150 nm over the gate oxide film 3. Then, the gate oxide film 3 and the polysilicon film 4 are patterned by means of photolithography and reactive ion etching to thereby form a layered structure 3a which will make a gate electrode.

Then, as illustrated in FIG. 1B, phosphorus (P) ion implantation is carried out to thereby form lightly doped source and drain regions 5-1 and 5-2 in self-aligned fashion with the patterned polysilicon film 4. Then, a silicon dioxide film having a thickness of about 100 nm is deposited over a resultant. An anisotropic reactive dry etching is carried out to the thus deposited silicon dioxide film to thereby form an insulating spacer 6 around the layered structure 3a. Then, a resultant is implanted, for instance, at 30 KeV with doses of $3 \times 10^{15}$ cm$^{-2}$ arsenic (As) to thereby form highly doped source and drain regions 7-1 and 7-2 at regions other than the patterned polysilicon film 4, the insulating spacer 6 and the device isolation regions 2.

Then, as illustrated in FIG. 1C, a resultant is implanted, for instance, at 30 KeV with doses of $3 \times 10^{14}$ cm$^{-2}$ arsenic (As) to make a surface of the silicon substrate 1 amorphous. After a naturally oxidized film is removed, sputtering is carried out to thereby deposit a titanium film 8 having a thickness of about 30 nm over the substrate 1.

Then, as illustrated in FIG. 1D, first lamp anneal is carried out to a resultant at 690° C. for 30 seconds in nitrogen atmosphere to thereby cause the titanium film 8 and the highly doped source and drain regions 7-1 and 7-2 to react with each other and also cause the titanium film 8 and the polysilicon film 4 to react with each other. As a result, as illustrated in FIG. 1D, there are formed titanium silicide layers 9 on both the polysilicon film 4 and the highly doped source and drain regions 7-1 and 7-2. By the first lamp anneal, the titanium layer 8 is converted to a layer 8a containing nitrogen, oxygen and titanium not having reacted with silicon. As illustrated in FIG. 1D, the layer 8a does not exist on the insulating spacer 6. By the first lamp anneal, there is further formed a denaturated layer 10 over the titanium layer 8a. Herein, the denaturated layer 10 is a layer made of the titanium layer 8 having reacted with both nitrogen and oxygen residual in the nitrogen atmosphere.

Then, as illustrated in FIG. 1E, the titanium film 8a is removed by means of a solution containing ammonia (NH$_3$) and hydrogen peroxide (H$_2$O$_2$), followed by second lamp annealing at 840° C. for 30 seconds to thereby form a titanium silicide layer 9a having a smaller resistance than the titanium silicide layer 9. The titanium silicide layers 9 and 9a mainly contain crystal forms C49 and C54, respectively.

Then, as illustrated in FIG. 1F, a silicon dioxide film 11 is deposited by about 1 μm over a resultant. Contact holes 12 are formed above the highly doped source and drain regions 7-1 and 7-2. Then, there is formed a barrier film 13 made of titanium and titanium nitride over an inner wall of the contact holes 12 by sputtering. Then, the contact holes 12 are filled with tungsten (W). Then, an aluminum film is formed all over a resultant, and patterned into a desired pattern to thereby form a wiring layer 15. Finally, a resultant is entirely covered with a cover film 16 made of silicon nitride.

The reason why the first lamp anneal for forming the titanium silicide layer 9 is carried out in nitrogen atmosphere is to prevent the titanium silicide layer 9 from growing horizontally from the titanium-silicon contact area to thereby deteriorate isolation between the gate electrode and the source/drain regions 7-1 and 7-2 and between wirings formed on the device isolation regions 2 such as word lines in a memory and the source/drain regions 7-1 and 7-2 in a MOS transistor. However, even this technique is not sufficient to prevent occurrence of current leakage. The reason is as follows. A rate for etching the denaturated layer 10 is quite small. Hence, it is not possible to sufficiently remove titanium when the denaturated layer 10 and the titanium film 8a are removed. As a result, electrically conductive materials leave non-removed at a surface of the insulating spacer 6 and the device isolation regions 2. Such electrically conductive materials deteriorate the isolation between the gate electrode and the source/drain regions and between wirings and the source/drain regions to thereby induce current leakage.

Japanese Unexamined Patent Publication 3-116837 has suggested a method for preventing occurrence of current leakage accompanied with the formation of a titanium silicide layer. In the suggested method, after the formation of the titanium film 8 as illustrated in FIG. 1C, a photolithography step is carried out to thereby form a mask out of a photoresist film on the titanium film 8 in a region other than regions such as the device isolation regions 2 and the insulating spacer 6 onto which a silicide layer is not allowed to grow. Then, oxygen ions are implanted into the titanium film 8 through regions not covered with the mask. Thus, oxygen ion implanted portions of the titanium layer 8 prevent silicon diffusion therebeyond during thermal annealing for converting a titanium layer into a titanium silicide layer.

However, the above mentioned method suggested in No. 3-116837 has shortcomings as follows. First, an additional photoresist step has to be carried out for forming the mask. Second, taking into consideration that a width of the insulating spacer 6, namely a width of a silicon dioxide film is quite small, and that it is difficult to avoid misregistration in pattern overlapping, it is quite difficult or almost impossible to form a silicide layer all over source/drain regions and a gate electrode, and hence the method disclosed in No. 3-116837 is not suitable for fabricating a semiconductor device in a smaller size and in higher integration.

SUMMARY OF THE INVENTION

In view of the above mentioned problems of prior art, it is an object of the present invention to provide a method of fabricating a semiconductor device, which method is capable of avoiding occurrence of current leakage which would be accompanied with silicidation, without carrying out an additional photoresist step.

There is provided a method of fabricating a semiconductor device, including the steps of (a) forming impurity-diffused layers at a surface of a silicon semiconductor substrate in selected regions, (b) forming a refractory metal film over the impurity-diffused layers, (c) carrying out first thermal annealing to convert the refractory metal film into a refractory metal silicide layer, (d) causing damage to a denaturated layer having been formed over the refractory metal film due to the first thermal annealing, (e) etching both the denaturated layer and non-reacted portions of the refractory metal film, and (f) carrying out second thermal annealing to reduce a resistance of the refractory metal silicide layer.

It is preferable that the first and second thermal annealings are carried out in nitrogen ($N_2$) atmosphere in the steps (c) and (f). The damage may be caused to the denaturated layer in several ways. For instance, the damage may be caused to the denaturated layer by arsenic (As) ion implantation. The etching in the step (e) is carried out preferably using a solution containing ammonia ($NH_3$) and hydrogen peroxide ($H_2O_2$) therein. By arsenic ion implantation, the denaturated layer can be readily removed when etched with the above mentioned solution. A metal of which the refractory film is made may be selected from titanium (Ti), cobalt (Co) and nickel (Ni).

There is further provided a method of fabricating a semiconductor device, including the steps of (a) forming impurity-diffused layers at a surface of a silicon semiconductor substrate in selected regions, (b) forming a refractory metal film over the impurity-diffused layers, (c) carrying out first thermal annealing to convert the refractory metal film into a refractory metal silicide layer, (d) oxidizing a denaturated layer having been formed over the refractory metal film due to the first thermal annealing, (e) etching both the thus oxidized denaturated layer and non-reacted portions of the refractory metal film, and (f) carrying out second thermal annealing to reduce a resistance of the refractory metal silicide layer.

The denaturated layer may be oxidized in the step (d) in various ways. For instance, the denaturated layer may be oxidized by being exposed to oxygen plasma. As an alternative, the denaturated layer may be oxidized by carrying out third thermal annealing in oxygen atmosphere, in which case the third thermal annealing is carried out preferably at a lower temperature than a temperature at which the second thermal annealing is to be carried out. By oxidation, the denaturated layer can be readily etched with the above mentioned solution containing ammonia and hydrogen peroxide.

There is still further provided a method of fabricating a semiconductor device, including the steps of (a) forming impurity-diffused layers at a surface of a silicon semiconductor substrate in selected regions, (b) forming a refractory metal film over the impurity-diffused layers, (c) oxidizing the refractory metal film to form an oxide layer over the refractory metal film, (d) carrying out first thermal annealing to convert the refractory metal film into a refractory metal silicide layer, (e) etching both the oxide layer and non-reacted portions of the refractory metal film, and (f) carrying out second thermal annealing to reduce a resistance of the refractory metal silicide layer.

The first thermal annealing carried out in nitrogen atmosphere after oxidation of the refractory metal film prevents the formation of a denaturated layer which is difficult to be etched with a solution containing ammonia and hydrogen peroxide.

In accordance with the present invention, it is possible to prevent occurrence of shortcircuit between a gate electrode and source/drain regions in a MOS transistor where a silicide layer ensures reduction in a parasitic resistance of source/drain regions, thereby preventing current leakage from a gate electrode to source/drain regions during operation of a MOS transistor and further preventing mutual communication between source/drain regions. Thus, malfunction and power consumption increase due to the above mentioned current leakage and mutual communication can be prevented.

The reason is as follows. There is formed a denaturated layer in a lamp anneal step in nitrogen atmosphere to be carried out for reacting a refractory film and silicon with each other. This denaturated layer has a small etching rate to a solution containing ammonia and hydrogen peroxide, and hence, it is difficult to etch the denaturated layer for removal together with non-reacted portions of the refractory metal film. On the other hand, in accordance with the present invention, the denaturated layer can be readily removed by etching together with non-reacted portions of the refractory metal film by causing a damage to the denaturated layer before carrying out the etching. A damage may be caused to the denaturated layer by arsenic ion implantation or oxidation.

As an alternative, by carrying out lamp anneal in nitrogen atmosphere for reacting a refractory film and silicon with each other after the refractory film has been oxidized at a surface thereof, it is possible to prevent a surface of the refractory film from being nitrided. Hence, it is possible to prevent electrically conductive materials from not being removed from surfaces of the insulating spacer and the device isolation regions, when non-reacted portions of the refractory film are etched for removal. Thus, the present invention makes it possible to prevent current leakage from a gate electrode to source/drain regions during operation of a MOS transistor, and further prevent mutual communication between source/drain regions.

As mentioned above, the present invention makes it possible to prevent occurrence of current leakage without addition of a photoresist step, thereby enhancing a fabrication yield and reliability of a semiconductor device.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

A method of fabricating a semiconductor device in accordance with the first embodiment of the present invention is described hereinbelow with reference to FIGS. 2A to 2G.

Figure 1A:
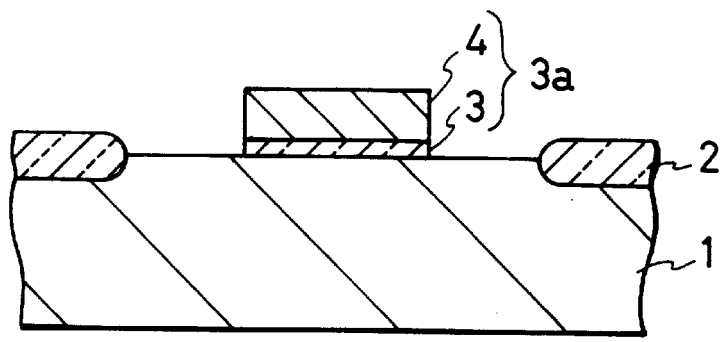
FIGS. 1A to 1F are cross-sectional views showing respective steps of a conventional method of fabricating a semiconductor device.
Figure 1B:
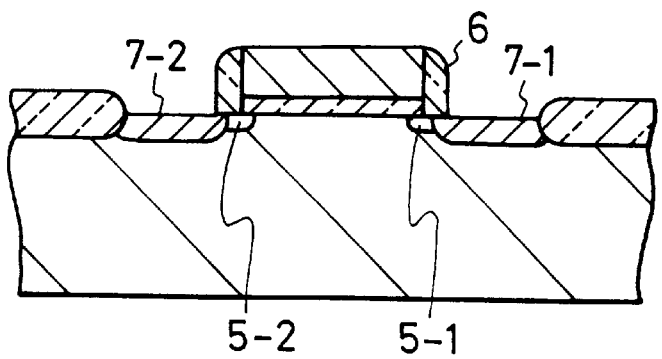
Figure 1C:
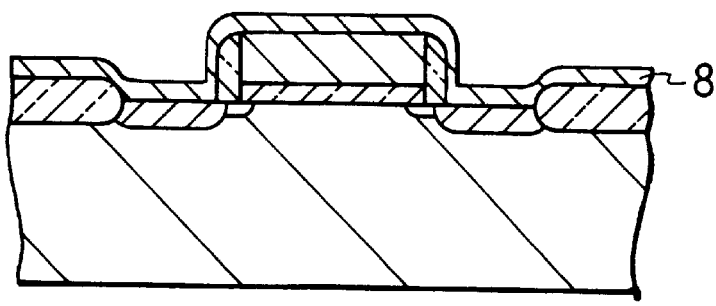
Figure 1D:
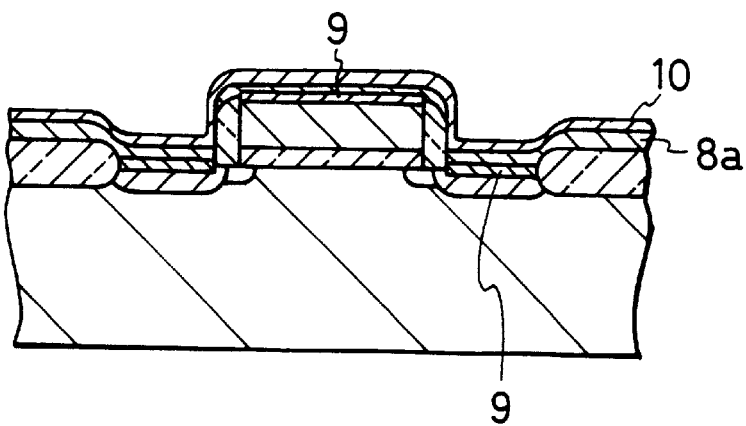
Figure 1E:
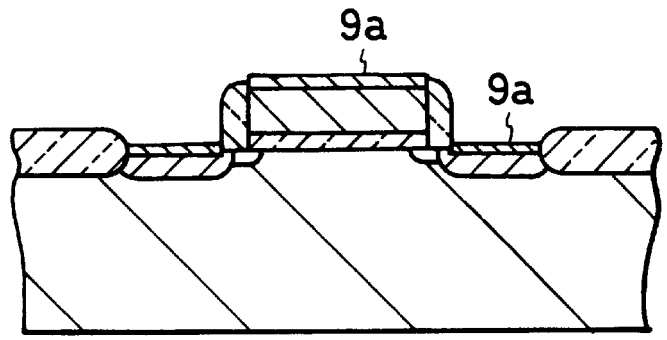
Figure 1F:
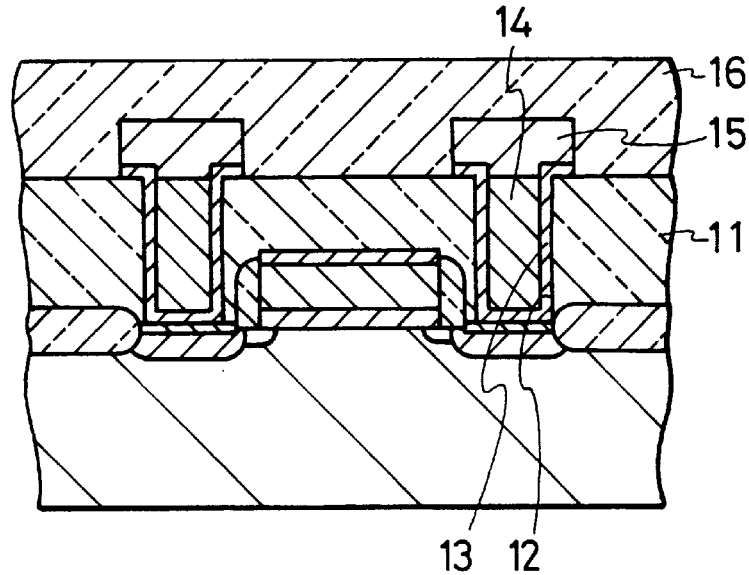
Figure 2A:
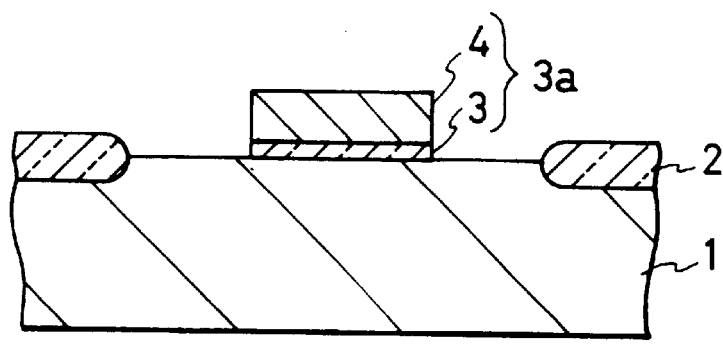
FIGS. 2A to 2G are cross-sectional views showing respective steps of a method of fabricating a semiconductor device to be carried out in accordance with the first embodiment of the present invention.

First, as illustrated in FIG. 2A, there are formed silicon dioxide films 2 having a thickness of about 300 nm at a surface of a p-type silicon semiconductor substrate 1. The silicon dioxide films 2 act as device isolation regions between which are defined device formation regions in each of which a device is to be established. Then, ion implantations are carried out over the device formation region for controlling a threshold value of a MOS transistor, to thereby form a gate oxide film 3 having a thickness of 10 nm over the device formation region and further a polysilicon film 4 having a thickness of about 150 nm over the gate oxide film 3. Then, the gate oxide film 3 and the polysilicon film 4 are patterned by means of photolithography and reactive ion etching to thereby form a layered structure 3a which will make a gate electrode.

Figure 2B:
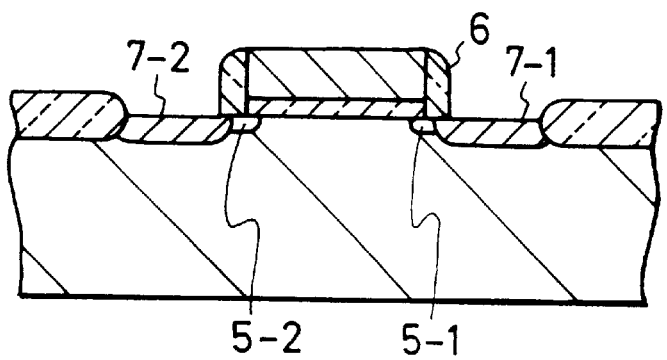

Then, as illustrated in FIG. 2B, phosphorus (P) ion implantation is carried out to thereby form lightly doped source and drain regions 5-1 and 5-2 in self-aligned fashion with the patterned polysilicon film 4. Then, a silicon dioxide film having a thickness of about 100 nm is deposited over a resultant. An anisotropic reactive dry etching is carried out to the thus deposited silicon dioxide film to thereby form an insulating spacer 6 on a sidewall of the layered structure 3a. Then, a resultant is implanted, for instance, at 30 KeV with doses of $3 \times 10^{15}$ cm$^{-2}$ arsenic (As) to thereby form highly doped source and drain regions 7-1 and 7-2 at regions other than the patterned polysilicon film 4, the insulating spacer 6 and the device isolation regions 2.

Figure 2C:
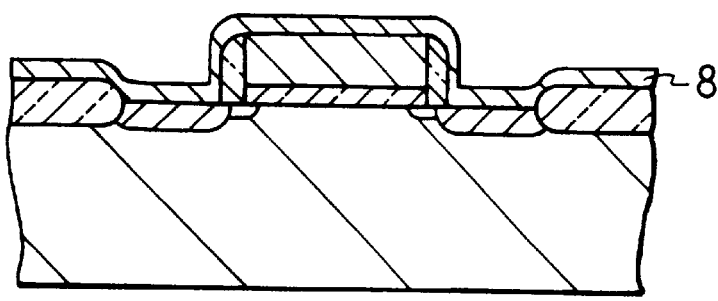

Then, as illustrated in FIG. 2C, a resultant is implanted, for instance, at 30 KeV with doses of $3 \times 10^{14}$ cm$^{-2}$ arsenic (As) to make a surface of the silicon substrate 1 amorphous. After a naturally oxidized film is removed, sputtering is carried out to thereby deposit a titanium film 8 having a thickness of about 30 nm all over the silicon substrate 1.

Figure 2D:
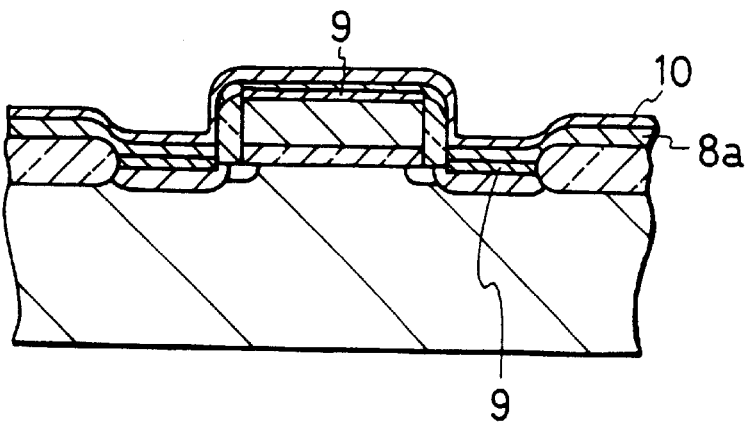

Then, as illustrated in FIG. 2D, first lamp anneal is carried out to a resultant at 690° C. for 30 seconds in nitrogen atmosphere to thereby cause the titanium film 8 and the highly doped source and drain regions 7-1 and 7-2 to react with each other and also cause the titanium film 8 and the polysilicon film 4 to react with each other. As a result, as illustrated in FIG. 2D, there are formed titanium silicide layers 9 on both the polysilicon film 4 and the highly doped source and drain regions 7-1 and 7-2. By the first lamp anneal, the titanium layer 8 is converted to a layer 8a containing nitrogen, oxygen and titanium not having reacted with silicon. As illustrated in FIG. 2D, the layer 8a does not exist on the insulating spacer 6. By the first lamp anneal, there is further formed a denaturated layer 10 over a resultant. Herein, the denaturated layer 10 is a layer made of the titanium layer 8 having reacted with both nitrogen and oxygen residual in the nitrogen atmosphere.

Figure 2E:
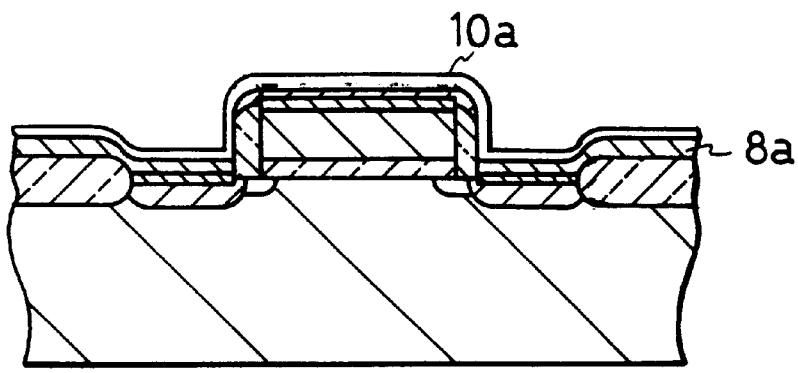

Then, the denaturated layer 10 is implanted, for instance, at 30 KeV with doses of $3 \times 10^{14}$ cm$^{-2}$ arsenic (As) to thereby cause a damage to the denaturated layer 10 (hereinafter, the damaged denaturated layer is referred to with a reference numeral "10a"), as illustrated in FIG. 2E.

Figure 2F:
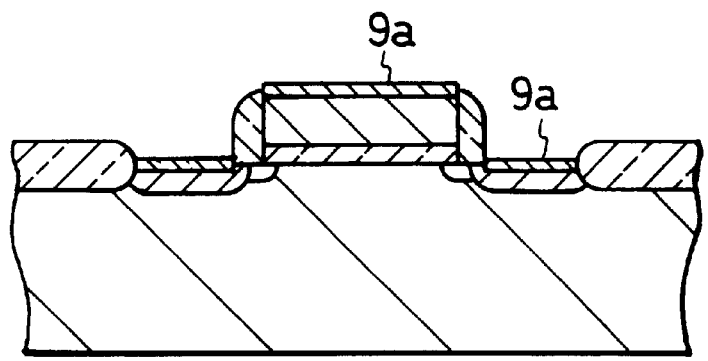

Then, as illustrated in FIG. 2F, both the damaged denaturated layer 10a and the non-reacted titanium film 8a is removed by means of a solution containing ammonia (NH$_3$) and hydrogen peroxide (H$_2$O$_2$), followed by second lamp annealing at 840° C. for 30 seconds to thereby form a titanium silicide layer 9a, which mainly low-resistive contains crystal form C54.

Figure 2G:
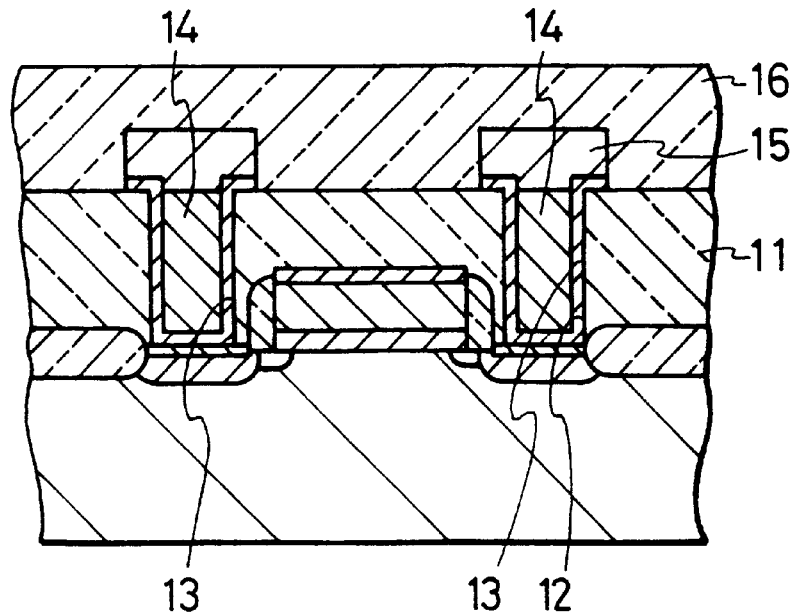

Then, as illustrated in FIG. 2G, a silicon dioxide film 11 is deposited by about 1 μm over a resultant. Contact holes 12 are formed above the highly doped source and drain regions 7-1 and 7-2. Then, there is formed a barrier film 13 made of titanium and titanium nitride over an inner wall of the contact holes 12 by sputtering. Then, the contact holes 12 are filled with tungsten (W). Then, an aluminum film is formed all over a resultant, and formed into a desired pattern to thereby form a wiring layer 15. Finally, a resultant is entirely covered with a cover film 16 made of silicon dioxide.

Since the above mentioned first embodiment includes a step of arsenic ion implantation to be carried out after the first lamp anneal at 690° C. for 30 seconds in nitrogen atmosphere, the titanium denaturated layer 10 formed on the titanium layer 8a by the first lamp anneal is cracked or damaged in other ways. Accordingly, the denaturated layer 10 can be readily peel off at the same time when the titanium layer 8a is etched in a subsequent step. Thus, there exist almost no electrically conductive materials on the insulating spacer 6 and the device isolation regions 2, thereby preventing current leakage in operation of the semiconductor device between the gate electrode and source/drain regions and also between the source/drain regions located adjacent with each other.

Figure 3A:
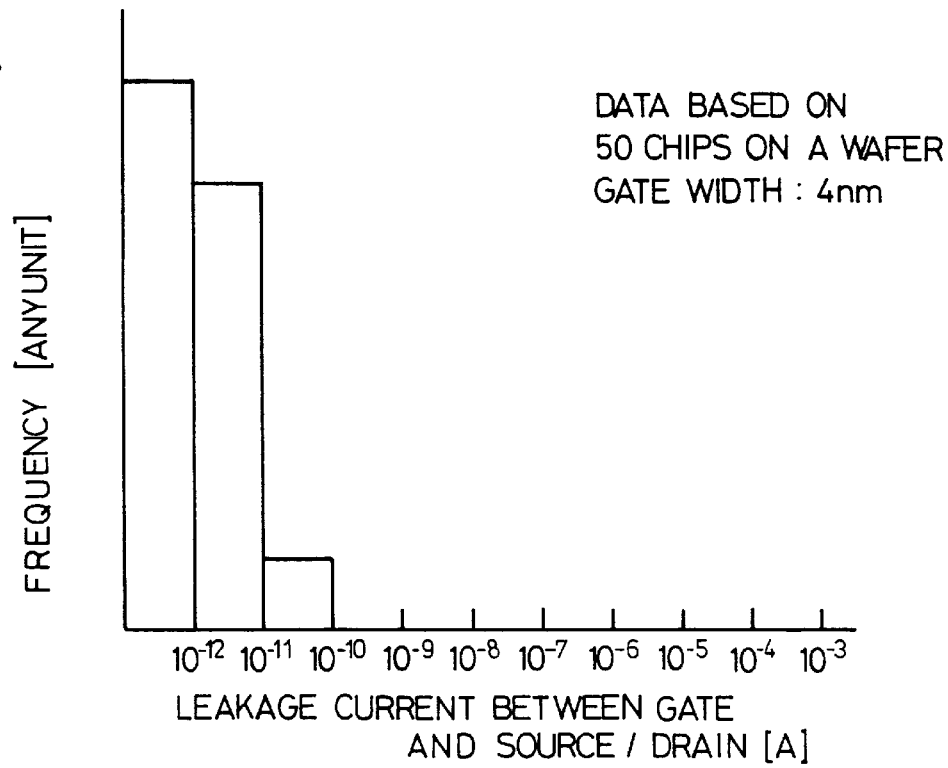
FIG. 3A is a graph showing frequency of current leakage in a MOS transistor made in accordance with the first embodiment of the present invention.
Figure 3B:
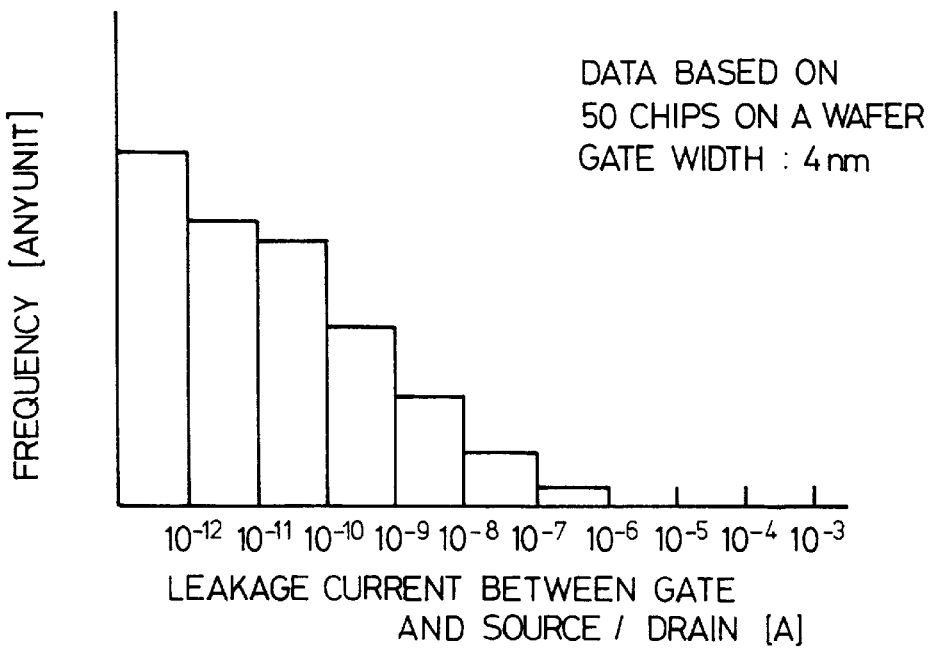
FIG. 3B is a graph showing frequency of current leakage in a MOS transistor made in accordance with a conventional method.

FIGS. 3A and 3B are graphs showing frequency of current leakage between a gate electrode and source/drain regions in a wafer. There was used a single chip on which transistors having a 4 nm wide gate were formed for evaluation. FIG. 3A shows the results for a transistor made in accordance with the first embodiment where arsenic ion implantation is carried out after the first lamp anneal, whereas FIG. 3B shows the results for a transistor made in accordance with a conventional method where no arsenic ion implantation is carried out. It is obvious that the arsenic ion implantation ensures the decreased number of current leakage between a gate electrode and source/drain regions.

In addition, assuming that a semiconductor device showing current leakage greater than 1 nA is an inferior one, a yield is about 85% when no arsenic ion implantation is carried out, whereas a yield is at least about 95% when arsenic ion implantation is carried out.

A method of fabricating a semiconductor device in accordance with the second embodiment of the present invention is described hereinbelow with reference to FIGS. 2A to 2C and FIGS. 4A to 4C.

Similarly to the first embodiment, as illustrated in FIG. 2A, there are first formed silicon dioxide films 2 having a thickness of about 300 nm at a surface of a p-type silicon semiconductor substrate 1. The silicon dioxide films 2 act as device isolation regions between which are defined device formation regions in each of which a device is to be established. Then, ion implantations are carried out over the device formation region to thereby form an about 10 nm thick gate oxide film 3 over the device formation region and further an about 150 nm thick polysilicon film 4 over the gate oxide film 3. Then, the gate oxide film 3 and the polysilicon film 4 are patterned by means of photolithography and reactive ion etching to thereby form a layered structure 3a which will make a gate electrode.

Then, as illustrated in FIG. 2B, phosphorus (P) ion implantation is carried out to thereby form lightly doped source and drain regions 5-1 and 5-2 in self-aligned fashion with the patterned polysilicon film 4. Then, an about 100 nm thick silicon dioxide film is formed, and anisotropically dry-etched to thereby form an insulating spacer 6 on a sidewall of the layered structure 3a. Then, a resultant is implanted, for instance, at 30 KeV with doses of $3 \times 10^{15}$ cm$^{-2}$ arsenic (As) to thereby form highly doped source and drain regions 7-1 and 7-2 at regions other than the patterned polysilicon film 4, the insulating spacer 6 and the device isolation regions 2.

Then, as illustrated in FIG. 2C, a resultant is implanted, for instance, at 30 KeV with doses of $3 \times 10^{14}$ cm$^{-2}$ arsenic (As) to make a surface of the silicon substrate 1 amorphous. After removal of a naturally oxidized film, sputtering is carried out to thereby deposit an about 300 nm thick titanium film 8 all over the silicon substrate 1.

Figure 4A:
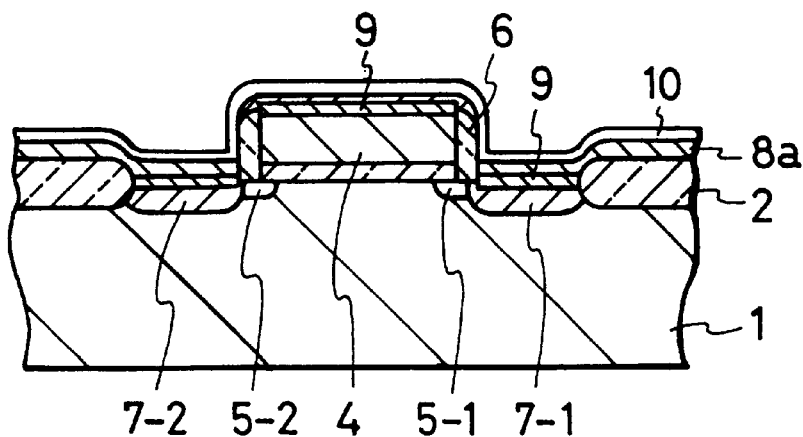
FIGS. 4A to 4C are cross-sectional views showing respective steps of a method of fabricating a semiconductor device to be carried out in accordance with the second embodiment of the present invention.

Then, as illustrated in FIG. 4A, first lamp anneal is carried out to a resultant at 690° C. for 30 seconds in nitrogen atmosphere to thereby cause the titanium film 8 and the highly doped source and drain regions 7-1 and 7-2 to react with each other and also cause the titanium film 8 and the polysilicon film 4 to react with each other. As a result, as illustrated in FIG. 4A, there are formed titanium silicide layers 9 on both the polysilicon film 4 and the highly doped source and drain regions 7-1 and 7-2. By the first lamp anneal, the titanium layer 8 is converted to a layer 8a containing nitrogen, oxygen and titanium not having reacted with silicon. As illustrated in FIG. 4A, the layer 8a does not exist on the insulating spacer 6. By the first lamp anneal, there is further formed a denaturated layer 10 over titanium layer 8a.

Figure 4B:
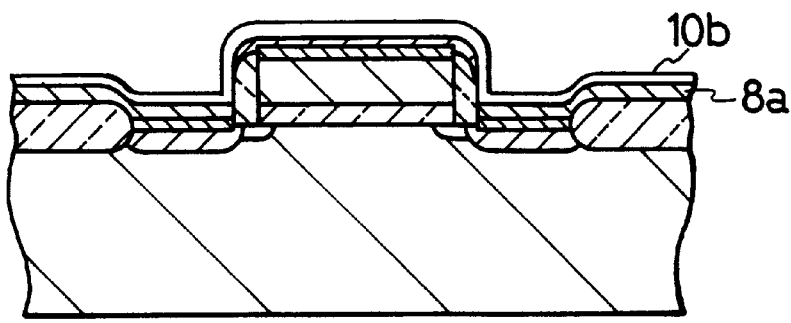

Then, a resultant is exposed to a plasma having been generated on the following conditions.
Substrate Temperature: 100–200° C.
Atmosphere: Oxygen Atmosphere
Pressure: 130 Pa
RF Power: 600 W
As a result, as illustrated in FIG. 4B, the denaturated layer 10 is oxidized (hereinafter, the thus oxidized denaturated layer is referred to with a reference numeral "10b").

In place of exposure to the above mentioned oxygen plasma, a resultant may be lamp-annealed at 650° C. for 30 seconds in O$_2$ atmosphere.

Figure 4C:
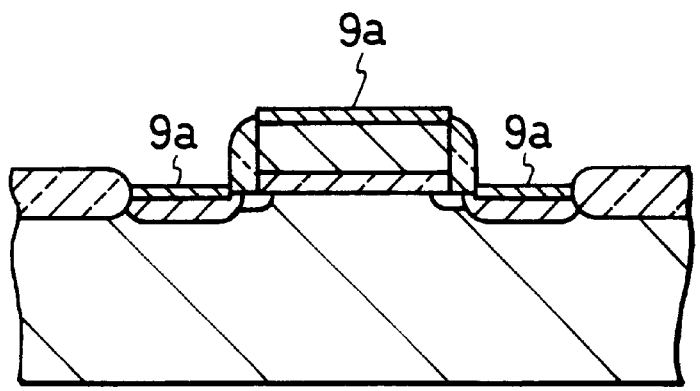

Then, as illustrated in FIG. 4C, the non-reacted titanium film 8a is removed by means of a solution containing ammonia (NH$_3$) and hydrogen peroxide (H$_2$O$_2$), followed by second lamp annealing at 840° C. for 30 seconds to thereby form a low-resistive titanium silicide layer 9a.

Then, similarly to the first embodiment, a silicon dioxide film 11 is deposited by about 1 μm over a resultant. Contact holes 12 are formed above the highly doped source and drain regions 7-1 and 7-2. Then, there is formed a barrier film 13 made of titanium and titanium nitride over an inner wall of the contact holes 12 by sputtering. Then, the contact holes 12 are filled with tungsten (W). Then, an aluminum film is formed all over a resultant, and formed into a desired pattern to thereby form a wiring layer 15. Finally, a resultant is entirely covered with a cover film 16 made of silicon dioxide (see FIG. 2G).

In the second embodiment, oxidation by exposure to the oxygen plasma is carried out after the first lamp anneal. Thus, the denaturated layer 10 formed over the titanium layer 8a in the first lamp anneal is oxidized, and hence, can be easily removed by etching when non-reacted titanium is etched out in a subsequent step. Thus, all but titanium silicide is removed by etching. As a result, there is left no electrically conductive materials on both the insulating spacer 6 and the device isolation regions 2, thereby ensuring that no current leakage occurs between a gate electrode and source/drain regions and also between source/drain regions in operation of a semiconductor device.

Figure 5A:
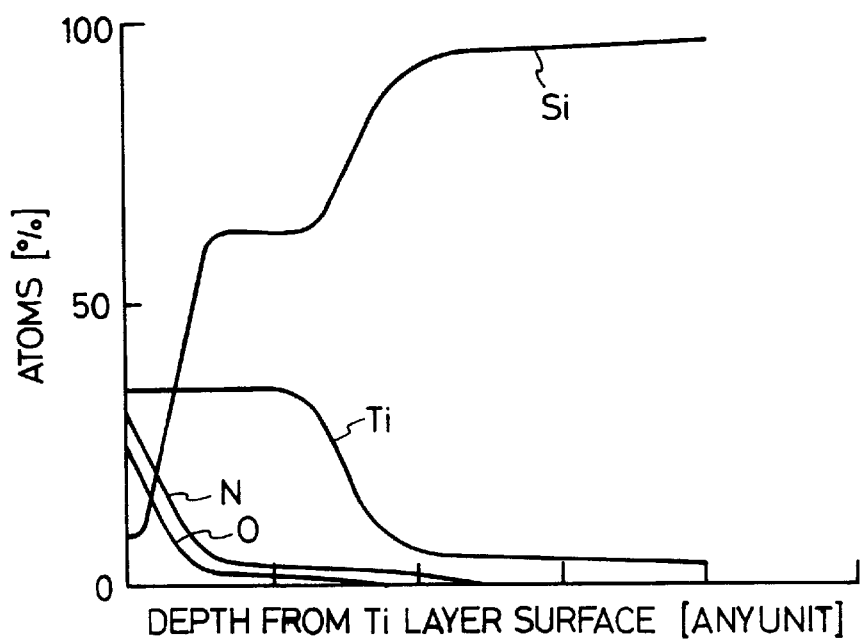
FIG. 5A is a graph showing the distribution of various elements found after a lamp anneal in nitrogen atmosphere in the second embodiment.
Figure 5B:
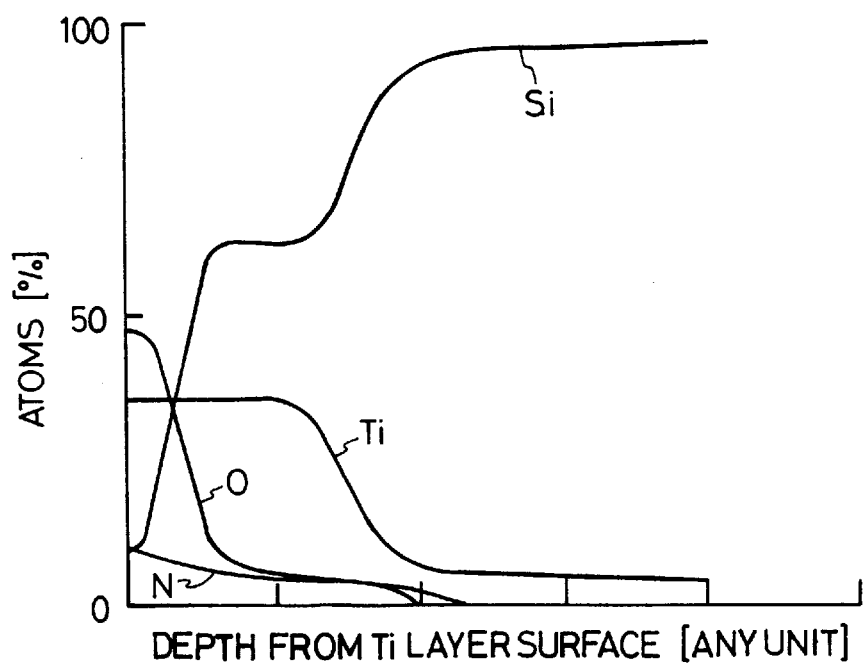
FIG. 5B is a graph showing the distribution of various elements found after oxidation by means of oxygen plasma in the second embodiment.

FIGS. 5A and 5B show the results of measuring how much percents of atoms are present in titanium after the first lamp anneal carried out in nitrogen atmosphere and after exposure to the oxygen plasma, respectively. The measurement was conducted with XPS.

Referring to FIG. 5B in comparison with FIG. 5A, it is understood that nitrogen atoms contained in the denaturated layer 10 are replaced with oxygen atoms by the oxygen plasma. As an etching rate of the denaturated layer 10 to a solution containing ammonia and hydrogen peroxide is about two times greater than that of titanium nitride (TiN), the denaturated layer 10 is unlikely to be left non-etched on the insulating spacer 6 and the device isolation regions 2. Accordingly, it is possible to remarkably reduce current leakage between a gate electrode and source/drain regions and between source/drain regions.

Figure 6A:
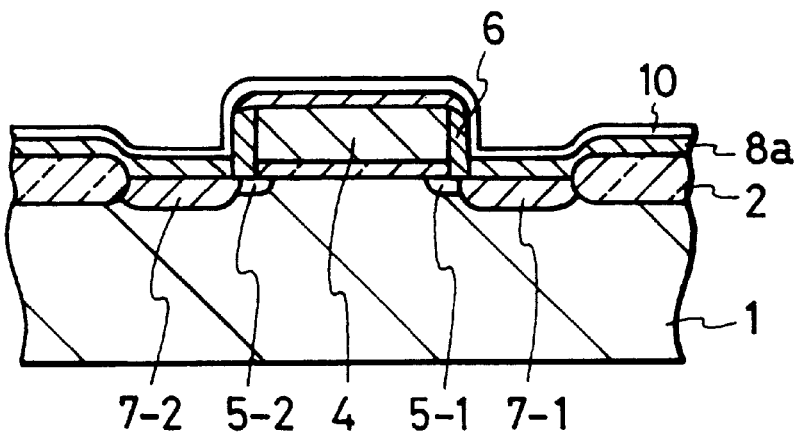
FIGS. 6A to 6C are cross-sectional views showing respective steps of a method of fabricating a semiconductor device to be carried out in accordance with the third embodiment of the present invention.
Figure 6B:
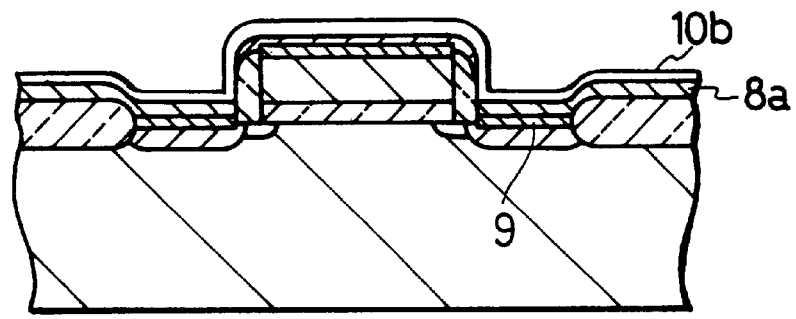

A method of fabricating a semiconductor device in accordance with the third embodiment of the present invention is described hereinbelow with reference to FIGS. 6A to 6C.

The third embodiment has the same steps as those of the first and second embodiments until the about 300 nm thick titanium film 8 is formed by sputtering.

Then, a resultant is exposed to an oxygen plasma having been generated on the following conditions.
Substrate Temperature: 100–200° C.
Atmosphere: Oxygen Atmosphere
Pressure: 130 Pa
RF Power: 600 W
As a result, as illustrated in FIG. 6A, the denaturated layer 10 is oxidized at a surface thereof, namely, titanium contained in the denaturated layer 10 is oxidized (hereinafter, the thus oxidized denaturated layer is referred to with a reference numeral "10c").

In place of exposure of the denaturated layer 10 to the above mentioned oxygen plasma, a resultant may be lamp-annealed at 650° C. for 30 seconds in O$_2$ atmosphere.

Then, first lamp anneal is carried out to a resultant at 690° C. for 30 seconds in nitrogen atmosphere to thereby cause a titanium film 8b and the highly doped source and drain regions 7-1 and 7-2 to react with each other and also cause the titanium film 8b and the polysilicon film 4 to react with each other. As a result, as illustrated in FIG. 6B, there are formed titanium silicide layers 9 on both the polysilicon film 4 and the highly doped source and drain regions 7-1 and 7-2. Since the denaturated layer 10c containing oxidized titanium covers the titanium film 8b therewith, it is possible to prevent a resultant from being nitrided at a surface thereof.

Figure 6C:
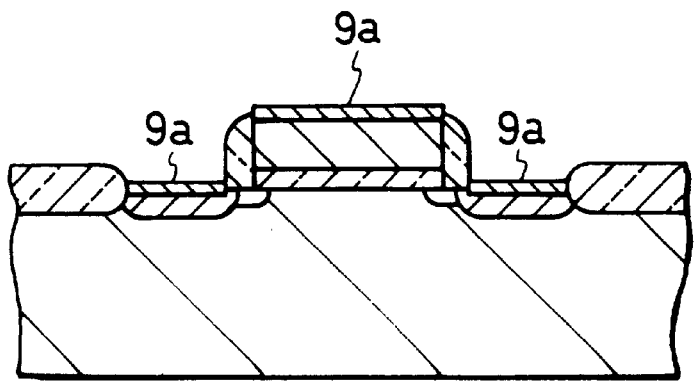

Then, as illustrated in FIG. 6C, the non-reacted titanium film 8b is removed by means of a solution containing ammonia ($NH_3$) and hydrogen peroxide ($H_2O_2$), followed by second lamp annealing at 840° C. for 30 seconds to thereby form a low-resistive titanium silicide layer 9a.

Then, similarly to the first and second embodiments, a silicon dioxide film 11 is deposited by about 1 μm over a resultant. Contact holes 12 are formed above the highly doped source and drain regions 7-1 and 7-2. Then, there is formed a barrier film 13 made of titanium and titanium nitride over an inner wall of the contact holes 12 by sputtering. Then, the contact holes 12 are filled with tungsten (W). Then, an aluminum film is formed all over a resultant, and formed into a desired pattern to thereby form a wiring layer 15. Finally, a resultant is entirely covered with a cover film 16 made of silicon dioxide (see FIG. 2G).

In the above mentioned third embodiment, oxidation accomplished by plasma in oxygen atmosphere is carried out after titanium sputtering, and hence the titanium film 8 is already oxidized at a surface thereof when the first lamp anneal is carried out at 690° C. for 30 seconds in nitrogen atmosphere in a subsequent step, thereby ensuring that a resultant is prevented from being nitrided at a surface thereof. Thus, it is possible to remove all but titanium silicide. As a result, similarly to the first and second embodiments, there is left no electrically conductive materials on both the insulating spacer 6 and the device isolation regions 2, thereby ensuring that no current leakage occurs between a gate electrode and source/drain regions and also between source/drain regions in operation of a semiconductor device.

Though a titanium silicide layer is exemplified in the above mentioned first to third embodiments, it should be noted that the present invention may be applied to the formation of a refractory silicide layer such as a cobalt (Co) silicide layer and a nickel (Ni) silicide layer.

In the above mentioned embodiments, crystal forms are converted to C54 from C49 in order to reduce a resistance of a titanium silicide layer. However, a titanium silicide layer resistance may be reduced by changing a proportion of refractory metal and silicon.

The present invention may be applied not only to a salicide structure where a silicide layer is formed in a gate electrode and source/drain regions in self-aligned fashion, but also to a structure where a silicide layer is formed only in source/drain regions.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device, comprising the steps of:
    (a) forming impurity-diffused layers at a surface of a silicon semiconductor substrate in selected regions;
    (b) forming a refractory metal film over said impurity-diffused layers;
    (c) carrying out first thermal annealing to convert said refractory metal film into a refractory metal silicide layer;
    (d) oxidizing a denaturated layer having been formed over said refractory metal film due to said first thermal annealing;
    (e) etching both the thus oxidized denaturated layer and non-reacted portions of said refractory metal film; and
    (f) carrying out second thermal annealing to reduce a resistance of said refractory metal silicide layer.

2. The method as set forth in claim 1, wherein said denaturated layer is oxidized by being exposed to oxygen plasma in said step (d).

3. The method as set forth in claim 1, wherein said denaturated layer is oxidized by carrying out third thermal annealing in oxygen atmosphere in said step (d).

4. The method as set forth in claim 3, wherein said third thermal annealing is carried out at a lower temperature than a temperature at which said second thermal annealing is to be carried out.

5. The method as set forth in claim 1, wherein said first thermal annealing is carried out in nitrogen ($N_2$) atmosphere in said step (c).

6. The method as set forth in claim 1, wherein said denaturated layer and non-reacted portions of said refractory metal film are etched in said step (e) using a solution containing ammonia ($NH_3$) and hydrogen peroxide ($H_2O_2$) therein.

7. The method as set forth in claim 1, wherein said second thermal annealing is carried out in nitrogen ($N_2$) atmosphere in said step (f).

8. The method as set forth in claim 1, wherein said refractory metal film is composed of one of titanium (Ti), cobalt (Co) and nickel (Ni).

* * * * *